(12) United States Patent
Chen et al.

(10) Patent No.: US 11,515,258 B2
(45) Date of Patent: Nov. 29, 2022

(54) PACKAGE SUBSTRATE AND MANUFACTURING METHOD THEREOF

(71) Applicant: Zhuhai ACCESS Semiconductor Co., Ltd, Zhuhai (CN)

(72) Inventors: Xianming Chen, Zhuhai (CN); Yejie Hong, Zhuhai (CN); Benxia Huang, Zhuhai (CN); Lei Feng, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 33 days.

(21) Appl. No.: 17/026,793

(22) Filed: Sep. 21, 2020

(65) Prior Publication Data

US 2022/0013462 A1 Jan. 13, 2022

(30) Foreign Application Priority Data

Jul. 13, 2020 (CN) .......................... 202010667146.7

(51) Int. Cl.
*H01L 23/538* (2006.01)
*H01L 21/50* (2006.01)
(Continued)

(52) U.S. Cl.
CPC .......... *H01L 23/5384* (2013.01); *H01L 21/50* (2013.01); *H01L 21/76802* (2013.01);
(Continued)

(58) Field of Classification Search
CPC ..... H01L 23/5384; H01L 23/15; H01L 21/50; H01L 21/76802; H01L 24/14; H01L 21/60
(Continued)

(56) References Cited

U.S. PATENT DOCUMENTS

2005/0161833 A1 7/2005 Takeuchi et al.
2015/0194627 A1 7/2015 Liu
(Continued)

FOREIGN PATENT DOCUMENTS

CN 101789380 A 7/2010
CN 103904054 A 7/2014
(Continued)

OTHER PUBLICATIONS

Chinese First Office Action, CN Application No. 202010667146.7 dated Jul. 26, 2021.
(Continued)

*Primary Examiner* — Quoc D Hoang
(74) *Attorney, Agent, or Firm* — The Dobrusin Law Firm, P.C.

(57) ABSTRACT

A method for manufacturing a package substrate, includes: providing a glass frame having a through hole and a chip embedding cavity; fixing an electronic component in the chip embedding cavity; coating a dielectric layer to an upper surface of the glass frame, the through hole and the chip embedding cavity and curing the dielectric layer; photoetching the dielectric layer to form an opening window arranged above the through hole; depositing metal through the opening window and patterning the metal to form a metal pillar and a circuit layer, the metal pillar passing through the through hole, the circuit layer being arranged on the upper surface and/or a lower surface of the glass frame and being connected to the electronic component and the metal pillar; forming a solder mask on a surface of the circuit layer, patterning the solder mask to form a pad connected to the circuit layer.

9 Claims, 4 Drawing Sheets

(51) Int. Cl.
  *H01L 21/768* (2006.01)
  *H01L 23/15* (2006.01)
  *H01L 23/00* (2006.01)
  *H01L 21/60* (2006.01)

(52) U.S. Cl.
  CPC .............. *H01L 23/15* (2013.01); *H01L 24/14* (2013.01); *H01L 21/60* (2021.08)

(58) Field of Classification Search
  USPC .......................... 257/698, 737, 774; 438/106
  See application file for complete search history.

(56) References Cited

U.S. PATENT DOCUMENTS

| | | | |
|---|---|---|---|
| 2017/0213793 A1 | 7/2017 | Hurwitz et al. | |
| 2020/0358163 A1* | 11/2020 | See | H01L 21/50 |

FOREIGN PATENT DOCUMENTS

| | | |
|---|---|---|
| CN | 107919334 A | 4/2018 |
| CN | 109727969 A | 5/2019 |
| CN | 111293098 A | 6/2020 |

OTHER PUBLICATIONS

Chinese First Search, CN Application No. 202010667146.7. dated Jul. 19, 2021.

Japanese First Office Action, JP Application No. 2020-151964 dated Nov. 3, 2021.

Taiwan First Office Action, TW Application No. 109131614 dated Aug. 6, 2021.

Taiwan Second Office Action, TW Application No. 109131614 dated Jan. 5, 2022.

* cited by examiner

PACKAGE SUBSTRATE AND MANUFACTURING METHOD THEREOF

CROSS-REFERENCE TO RELATED APPLICATIONS

This patent application claims the benefit of Chinese patent application No. 202010667146.7, filed Jul. 13, 2020, which is incorporated by reference herein in its entirety.

TECHNICAL FIELD

The present application relates to the technical field of semiconductor packaging, and in particular to a package substrate and a manufacturing method thereof.

BACKGROUND

With the rapid development of the electronics industry, the electronic products are becoming increasingly lighter and thinner with increasingly higher degree of integration. The packaging method using embedded package substrates has been greatly developed. At present, in the application of embedded package substrates, the packaging is usually implemented by press-fitting organic dielectric material after mounting electronic component.

However, at present, the organic dielectric material mainly includes polyimide, epoxy resin or bismaleimide-triazine resin or their blends with glass fibers. Such material is high in both dielectric constant (Dk) and dielectric loss (Df). In the process of electrical signal transmission, it will cause long delay time and high electrical signal loss, which greatly limits the application of high-frequency products. Meanwhile, the organic dielectric material is quite different from the embedded electronic component or chip in terms of coefficient of thermal expansion (CTE). Under extreme conditions, it is prone to reliability problems due to the mismatch of expansion and contraction. In addition, the traditional press-fitting method used in the packaging process has a risk of cracking the chip during the press-fitting process.

SUMMARY

The present application aims at solving one of the technical problems in the related art at least to certain extent. For this purpose, the present application proposes a package substrate and a manufacturing method thereof. The following is the summary of the subject described in detail herein. This summary is not intended to limit the protection scope defined by the claims. The technical schemes will be described below.

In a first aspect, an embodiment of the present application provides a method for manufacturing a package substrate, comprising following steps of:

providing a glass frame having a through hole and a chip embedding cavity;

fixing an electronic component in the chip embedding cavity;

coating a dielectric layer to an upper surface of the glass frame, the through hole and the chip embedding cavity and curing;

photoetching the dielectric layer to form an opening window which is arranged above the through hole and the electronic component;

depositing metal through the opening window and patterning the metal to form a metal pillar and a circuit layer, the metal pillar passing through the through hole, the circuit layer being arranged on the upper surface and a lower surface of the glass frame and being connected to the electronic component and the metal pillar; and forming a solder mask on a surface of the circuit layer, and patterning the solder mask to form a pad which is connected to the circuit layer.

According to the method for manufacturing a package substrate in the embodiment of the first aspect of the present application, the present application at least has the following beneficial effects: firstly, the package substrate proposed in the present application uses a glass frame instead of an organic matrix frame, reduces the electrical signal transmission loss of electronic component due to the low dielectric constant and low dielectric loss of glass, increases the transmission speed of electrical signals and thus improves the performance of electrical signal transmission; secondly, since the glass frame has a wider coefficient of thermal expansion (CTE), there are many selections in matching with the material for the embedded electronic component, and under extreme conditions, the design requirements and reliability of the products can be met; thirdly, the packaging by press-fitting is replaced with coating of packaging dielectric material, which reduces the press-fitting force applied onto the electronic component in the packaging process and reduces the risk of cracking the electronic component during the manufacturing process of the embedded products; and fourthly, the processing cost of the glass substrate is low, which can effectively reduce the manufacturing cost of the products.

Optionally, in one embodiment of the present application, the opening window may also be arranged above the electronic component.

Optionally, in one embodiment of the present application, the method further includes: depositing a metal seed layer, the metal seed layer being attached to a sidewall of the through hole and to the dielectric layer and surfaces of the electronic component.

Optionally, in one embodiment of the present application, the metal seed layer material includes metal titanium and metal copper.

Optionally, in one embodiment of the present application, the method further includes: forming a protective layer on a surface of the pad.

Optionally, in one embodiment of the present application, material for the protective layer includes at least one of nickel palladium gold, nickel gold, tin, silver, and ganic solderability preservative.

Optionally, in one embodiment of the present application, the number of the through hole and the chip embedding cavity is at least one, and the plurality of chip embedding cavities may have the same or different volumes.

Optionally, in one embodiment of the present application, the dielectric layer is photosensitive resin material with fluidity.

In a second aspect, an embodiment of the present application provides a package substrate, including:

a glass frame having a through hole and a chip embedding cavity;

an electronic component arranged in the chip embedding cavity;

a dielectric layer filled on an upper surface of the glass frame and in the chip embedding cavity;

a metal pillar passing through the through hole;

a circuit layer arranged on the upper surface and/or a lower surface of the glass frame and connected to the electronic component and the metal pillar; and a solder mask arranged on a surface of the circuit layer and having a pad which is connected to the circuit layer.

According to the package substrate in the embodiment of the second aspect of the present application, the present application at least has the following beneficial effects: firstly, the package substrate proposed in the present application uses a glass frame instead of an organic matrix frame, reduces the electrical signal transmission loss of electronic component due to the low dielectric constant and low dielectric loss of glass, increases the transmission speed of electrical signals and thus improves the performance of electrical signal transmission; secondly, since the glass frame has a wider coefficient of thermal expansion (CTE), there are many selections in matching with the material for the embedded electronic component, and under extreme conditions, the design requirements and reliability of the products can be met; thirdly, the packaging by press-fitting is replaced with coating of packaging dielectric material, which reduces the press-fitting force applied onto the electronic component in the packaging process and reduces the risk of cracking the electronic component during the manufacturing process of the embedded products; and fourthly, the processing cost of the glass substrate is low, which can effectively reduce the manufacturing cost of the products.

Optionally, in one embodiment of the present application, the package structure further includes a metal seed layer which is attached to a sidewall of the through hole and to the dielectric layer and a surface of the electronic component.

Optionally, in one embodiment of the present application, the package structure further includes a protective layer arranged on a surface of the pad.

Other features and advantages of the present application will be described in the following description, and partly become apparent from the description or shall be understood by implementing the present application. The purposes and other advantages of the present application can be realized and obtained through the structures specifically specified in the specification, claims and drawings.

BRIEF DESCRIPTION OF THE DRAWINGS

The accompanying drawings are used to provide further understanding of the technical solution of the present application, and constitute part of the specification. The accompanying drawings are used to, together with the embodiments of the present application, explain the technical solution of the present application, and do not constitute any limitation to the technical solution of the present application.

FIG. 9 is a sectional view of a package substrate according to another embodiment of the present application, in which:

100: glass frame; 110: through hole; 120: chip embedding cavity; 200: electronic component; 300: dielectric layer; 310: opening window; 410: metal pillar; 420: circuit layer; 500: solder mask; 510: pad; 600: metal seed layer; 800: photosensitive barrier layer; and 900: tape.

DETAILED DESCRIPTION

In order to make the purposes, technical schemes and advantages of the present application clearer, the present application will be further described below in detail with reference to the accompanying drawings by embodiments. It should be understood that the specific embodiments to be described here are only used to explain the present application, not to limit the present application, and therefore have no technical substantive meaning. Any structural modification, proportional change or size adjustment shall be within the scope of the technical content disclosed in the present application without affecting the effects and purposes that can be achieved by the present application.

This section will describe the specific embodiments of the present application in detail. The preferred embodiments of the present application are shown in the drawings. The drawings are provided to supplement, with graphics, the description of the text part of the specification, so that people can intuitively and visually understand technical features and overall technical solution of the present application, and should not be understood as any limitation to the protection scope of the present application.

In the description of the present application, "several" means "one or more"; "a plurality of" means "two or more"; "greater than", "less than", "exceeding" or the like should be considered as excluding the number; and "above", "below", "within" or the like should be considered as including the number. Terms "first" and "second" are used only for the purpose of distinguishing the technical features, and should not be understood as indicating or implying relative importance or implicitly indicating the number of the stated technical features or implicitly indicating the precedence of the stated technical features.

Figure 1:
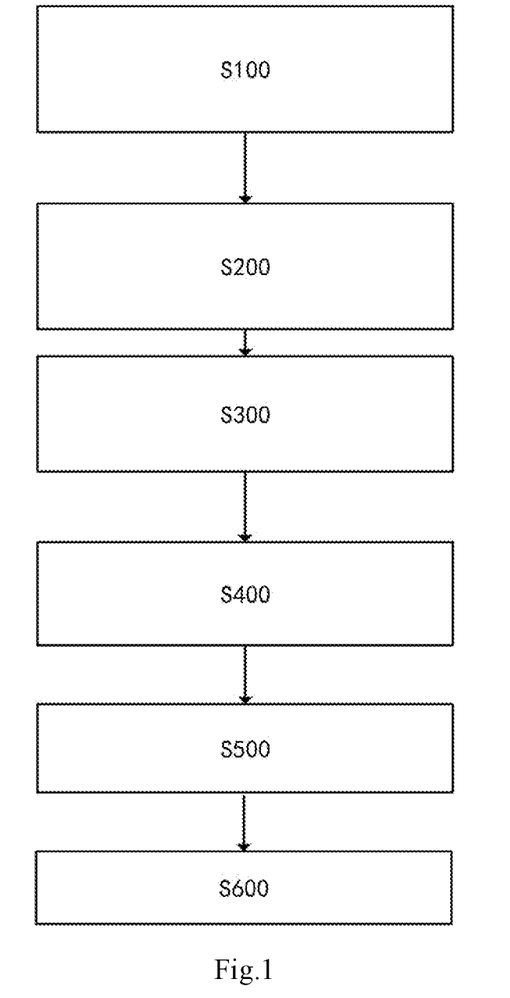
FIG. 1 is a flowchart of steps of a method for manufacturing a package substrate according to an embodiment of the present application.
Figure 2:
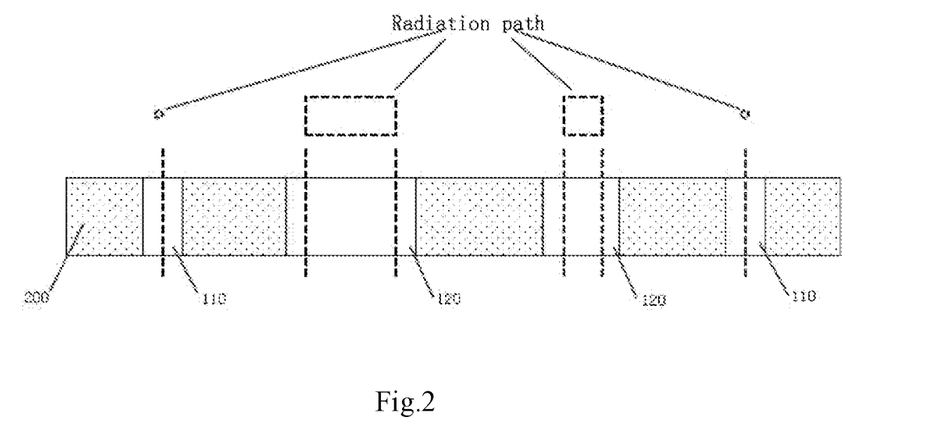
FIGS. 2-8 are sectional views corresponding to steps of a method for manufacturing a package substrate according to another embodiment of the present application.

Referring to FIG. 1, an embodiment of the present application provides a method for manufacturing a package substrate, including following steps of:

At S100, a glass frame 100 is provided, which has a through hole 110 and a chip embedding cavity 120. Specifically, as shown in FIG. 2, a glass substrate, usually transparent glass, is first prepared. The glass substrate may have a thickness determined according to the requirements of the embedded structure. The glass substrate is processed by laser. The property of the glass in a laser path is changed to allow for etching by an etching solution to form a glass frame 100 having a through hole 110 and a chip embedding cavity 120. The etching solution is mainly hydrofluoric acid solution. The concentration of the etching solution may be adjusted according to the requirements on an etching rate and an etching thickness. It should be noted that laser processing uses high-energy-density beams to irradiate the surface of the material to vaporize or change the color of the material. During the laser processing, the laser beams have high energy density and high processing speed, and the laser processing is performed locally, which has no or minimal impact on non-laser irradiated parts. In the micro-electronics industry, laser beams can be used for the processing of semiconductor devices and chips, and also for the processing of precise optical devices. There is at least one laser chip embedding cavity 120 and at least one through hole 110, which are used for embedding electronic component 200 and realizing electrode extraction and heat dissipation of the electronic component 200, respectively. In an embodiment of the present application, there are two chip embedding cavities 120 with different volumes, and electronic component 200 of different models and sizes may be mounted therein; and there are two through holes 110 which are correspondingly arranged on a side of the two chip embedding cavities 120, respectively.

Figure 3:
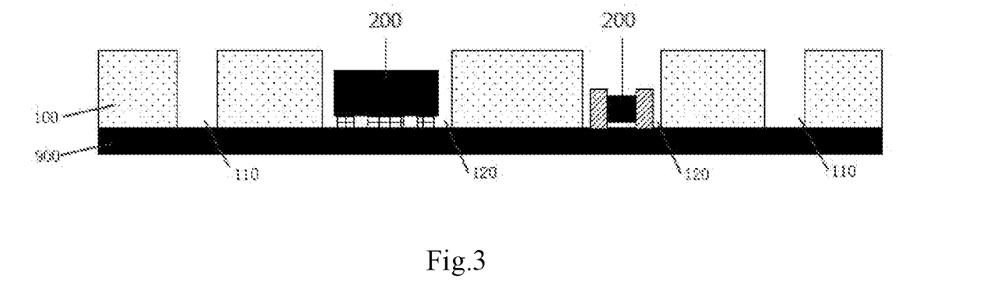

At S200, electronic component 200 is fixed in the chip embedding cavity 120. Specifically, as shown in FIG. 3, a tape 900 is pasted on a bottom of the glass frame 100 to temporarily close the through hole 110 and the bottom of the chip embedding cavity 120. The tape 900 can pre-fix the electronic component 200 attached later. The electronic components 200 are mounted in the two chip embedding cavities 120 with different volumes, and one end of each of the electronic components 200 is made to come in contact with and be fixed to the tape 900. It should be noted that, the electronic components 200 each have a front side and a back side, depending upon the presence of connection terminals. The electronic components 200 include but are not limited to devices and chips. They may be active devices or passive devices, independent chips or devices, or a combination of multiple chips or devices; or, in terms of the use purposes, may be different power devices, radio frequency or logic chips. The type and number of chips or devices may be determined according to the actual needs. Multiple chips may be stacked back to back in a 3D form, or may be designed in an array having a single layer in up, down, left and right directions. The electronic components 200 may be mounted face down in the chip embedding cavity 120, or may be mounted reversely in the chip embedding cavity 120. The specific direction, number and type of the electronic components 200 to be mounted may be determined according to design requirements and are within the protection scope of the present application.

Figure 4:
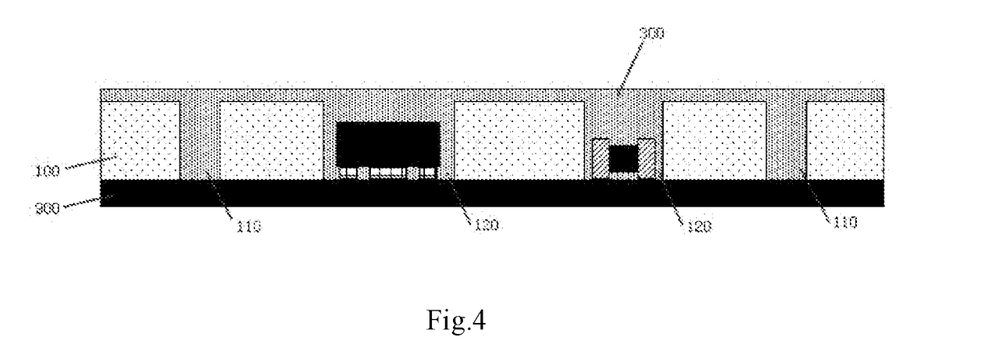

At S300, a dielectric layer 300 is coated on an upper surface of the glass frame 100, the through hole 110 and the chip embedding cavity 120 and pre-cured. Specifically, as shown in FIG. 4, after the electronic components 200 are mounted, the dielectric layer 300 is coated on the upper surface of the glass frame 100. The material for the dielectric layer 300 is photosensitive resin material with fluidity. Owning to the fluidity of the resin material, the resin material fills the through hole 110 and the chip embedding cavity 120 in which the electronic components 200 are mounted. The resin material is coated and then pre-baked to be made in the pre-cured state. It should be noted that the photosensitive resin material is thermosetting resin material, including JSR WPR (water-soluble phenolic resin) series, Hitachi AR-5100 (Acrylic) series, Asahi LV (Polyoxymethylene) series, etc., which have a viscosity of 10 Pa·s to 10000 Pa·s during coating.

Figure 5:
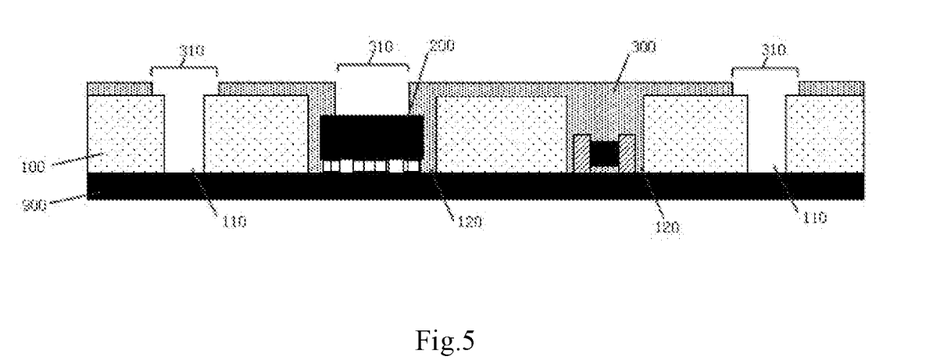

At S400, the dielectric layer 300 is photoetched to form an opening window 310. The opening window 310 is formed above the through hole 110 and the electronic components 200. Specifically, as shown in FIG. 5, the photosensitive resin material is exposed to light, developed and patterned to form an opening window 310 above the through hole 110 to expose the through hole 110 of the glass frame 100. Meanwhile, depending upon whether the electronic components 200 need to dissipate heat or not, the photosensitive resin material may be photoetched to form an opening window 310 on the back of the electronic components 200. Then, the electronic component 200 may be plated at a back side thereof with metal for heat dissipation. After exposure and development, the photosensitive resin material is post-baked to be completely cured. It should be noted that the opening window may be selectively formed on the back side according to the size and heat dissipation requirements of the electronic components 200. For electronic components 200 with a large area and high heat dissipation requirements, after forming the opening window 310, deposition of metal on the back side can be carried out to dissipate heat. For electronic components 200 with a small area and low heat dissipation requirements, the opening window 310 may not be formed. The heat dissipation can be done directly through the dielectric layer 300.

Figure 6:
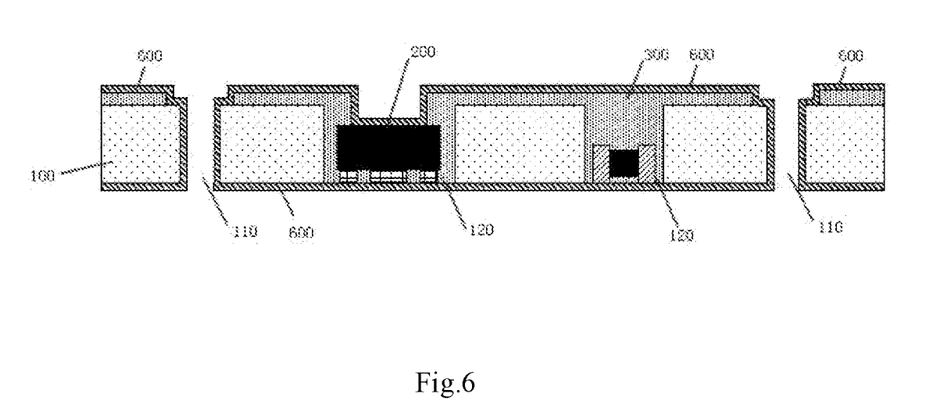
Figure 7:
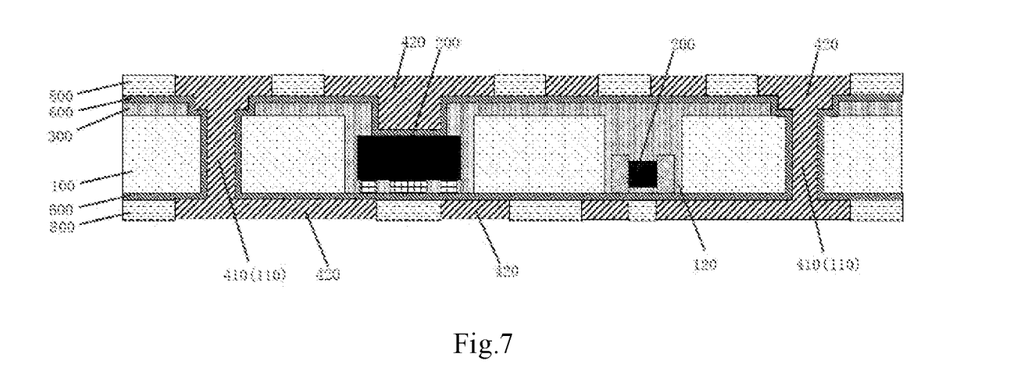
Figure 8:
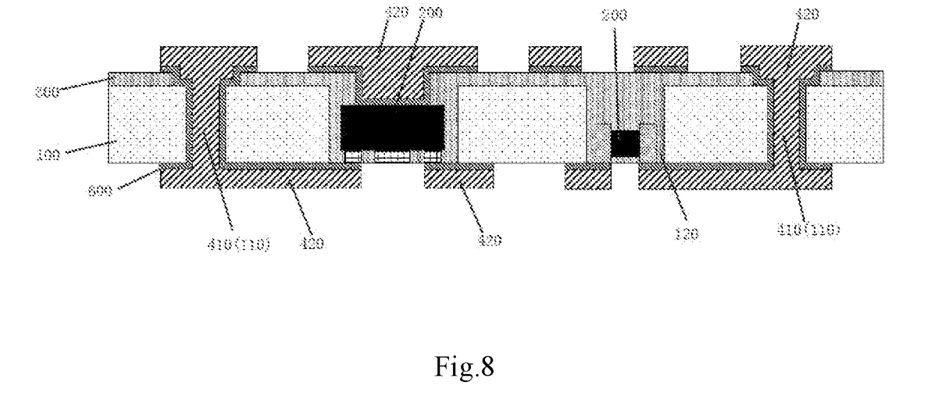

At S500, metal is deposited through the opening window 310, and the metal is patterned to form a metal pillar 410 and a circuit layer 420. The metal pillar 410 runs through the through hole 110. The circuit layer 420 is arranged on the upper surface and a lower surface of the glass frame 100 and connected to the electronic components 200. Specifically, as shown in FIG. 6, the tape 900 pasted on the lower surface of the glass frame 100 is removed, and a metal seed layer 600 is fabricated on the upper and lower surfaces of the glass frame 100 so that the metal seed layer 600 covers a sidewall of the through hole 110. The metal seed layer 600 is fabricated on the surface of the electronic components 200 exposed from the opening window and also in the surrounding of the entire glass frame 100, by deposition of copper and physically sputtering metal titanium and metal copper (Ti/Cu). In the embodiments of the present application, preferably, it is fabricated by physically sputtering Ti/Cu. The thickness of Ti/Cu may be adjusted comprehensively according to the process capability. The Ti usually has a thickness of 50 nm to 150 nm, and the Cu usually has a thickness of 0.5 um to 1.5 um. As shown in FIG. 7, after the formation of the seed layer, a photosensitive barrier layer 800 is attached on a surface of the seed layer, and the photosensitive barrier layer 800 is patterned to expose the circuit layer 420 and the through hole 110. The seed layer is electroplated with metal, specifically electroplated with metal copper to allow the metal copper to cover the through hole 110 and also an upper surface of the metal seed layer 600 at a specific position, in order to form a metal pillar 410 and a circuit layer 420. Part of the circuit layer 420 is connected to the electronic components 200 through the metal seed layer 600 to realize heat dissipation and electrode extraction. As shown in FIG. 8, an organic or inorganic stripping solution is used for stripping, the photosensitive barrier layer 800 is removed, and the metal seed layer 600 is etched to keep the metal seed layer 600 consistent with the circuit layer 420. It should be noted that the circuit layer 420 and the metal pillar 410 may be formed by another process. Specifically, the surrounding of the entire glass frame 100 is electroplated with metal copper to form a metal pillar 410, the metal copper on the surface is patterned and etched to form the circuit layer 420, and then stripping is performed to etch the metal seed layer 600. In addition, in some embodiments of the present application, multiple layers of glass frames 100 may be packaged. For example, two or more layers of glass frames may be packaged. The packaging may be designed according to actual wiring requirements of the products.

Figure 9:
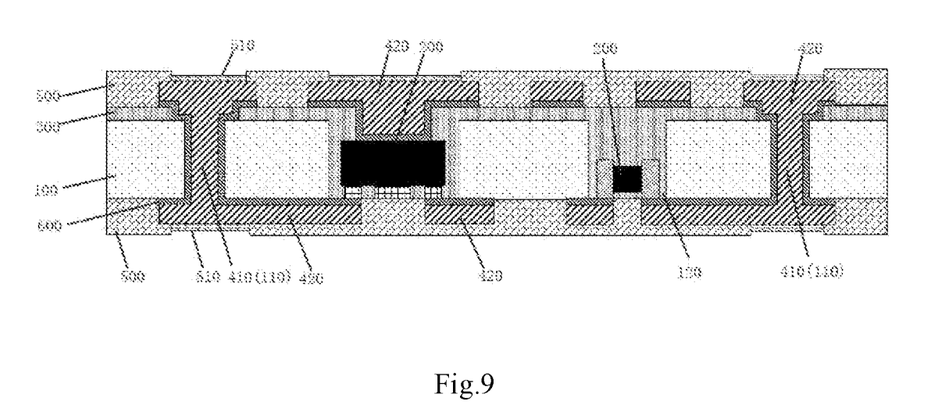

At S600, a solder mask 500 is formed on the surface of the circuit layer 420, and the solder mask 500 is patterned to form pads 510 which are connected to the circuit layer 420. Specifically, as shown in FIG. 9, the solder mask 500 is formed on the upper and lower surfaces of the structure shown in FIG. 8. The solder mask 500 has a thickness determined according to actual needs. According to the electrode position requirements, the solder mask 500 is patterned to form the pads 510. Specifically, pads 510 are formed on upper and lower surfaces of the metal pillar 410 and the surface of the electronic component 200, respectively. In one embodiment of the present application, part of the circuit layer 420 is connected to lead terminals of the electronic components 200, and connected to the metal pillar 410 and the pads 510 on the surfaces of the metal pillar 410 through the circuit layer 420, for the purpose of electrode extraction and heat dissipation of the electronic components 200. Part of the circuit layer 420 directly covers the surface of the electronic components 200, for the purpose of heat dissipation through the circuit layer 420 and the pads 510. A protective layer is further formed on the surface of the pads 510. The protective layer can prevent the pads 510 from oxidation, enhancing the reliability of the substrate. The protective layer may be deposited with chemically stable metals such as nickel-palladium-gold, nickel-gold, tin, and silver, and may also be deposited with organic solderability preservative for the purpose of surface treatment.

Referring to FIG. 9, the present application provides a package substrate including: a glass frame 100 having a through hole 110 and a chip embedding cavity 120; electronic components 200 arranged in the chip embedding cavity 120; a dielectric layer 300 filled on an upper surface of the glass frame 100 and the chip embedding cavity 120; a metal pillar 410 passing through the through hole 110; a circuit layer 420 arranged on the upper surface and a lower surface of the glass frame 100 and connected to the electronic components 200 and the metal pillar 410; and a solder mask 500 arranged on the surface of the circuit layer 420 and having pads 510 which are connected to the circuit layer 420.

In one embodiment, the glass frame 100 is made of transparent material. One or more through holes 110 and chip embedding cavities 120 are formed in the glass frame 100. The chip embedding cavity 120 is used for mounting electronic components 200. The volume and number of the chip embedding cavity 120 are determined according to the type and number of the electronic components 200 to be embedded in the substrate. A dielectric layer 300 is arranged on an upper surface of the glass frame 100, and the dielectric layer 300 is filled in the chip embedding cavity 120. The electronic components 200 are wrapped, fixed and laid flat on the upper surface of the glass frame 100. On one hand, the electronic components 200 can be fixed to the glass frame 100 through the dielectric layer 300. On the other hand, the dielectric layer 300 can protect and prevent the glass substrate from breaking. A metal pillar 410 is formed in the glass substrate, which runs through the through hole 110 and extends out of the upper and lower surfaces of the glass frame 100 to be connected to the circuit layer 420. The circuit layer 420 is also connected to the electronic components 200. On one hand, heat generated by the electronic components 200 can be transferred to the metal pillar 410 through the circuit layer 420 for heat dissipation. On the other hand, the electrode may be extracted through the circuit layer 420 to facilitate connection with other components or substrates. A solder mask 500 is formed on an outermost layer of the circuit layer 420, for the purpose of substrate insulation. The pads 510 are formed on the solder mask 500 at positions corresponding to the metal pillar 410 and the circuit layer 420, for the purpose of electrical connection or testing.

Referring to FIG. 9, an embodiment of the present application provides a package substrate, further including a metal seed layer 600 attached to the sidewall of the through hole 110 and to the dielectric layer 300 and the surface of the electronic components 200.

In one embodiment, a metal seed layer 600 is further formed on the upper and lower surfaces of the glass frame 100, respectively, to cover the sidewall of the through hole 110. The thickness of the metal seed layer 600 may be adjusted comprehensively according to the process capability. In an embodiment of the present application, preferably, the thickness of metal titanium is usually 50 nm to 150 nm, and the thickness of metal copper is usually 0.5 um to 1.5 um.

Referring to FIG. 9, an embodiment of the present application provides a package substrate, further including a protective layer arranged on surfaces (not shown) of the pads 510. In one embodiment, the protective layer can prevent the pads 510 from oxidation, enhancing the reliability of the substrate. The material for the protective layer includes chemically stable metals such as nickel-palladium-gold, nickel-gold, tin and silver, or organic solderability preservative.

The above is the specific description of preferred implementations of the present application, but the present application is not limited to the above-mentioned implementations. Those skilled in the art can make various equivalent modifications or replacements without departing from the spirit of the present application, and those equivalent modifications or replacements shall be included in the scope defined by the claims of the present application.

What is claimed is:

1. A method for manufacturing a package substrate, comprising:
    providing a glass frame having a through hole and a chip embedding cavity;
    fixing an electronic component in the chip embedding cavity;
    coating a dielectric layer to an upper surface of the glass frame, the through hole and the chip embedding cavity and curing the dielectric layer;
    photoetching the dielectric layer to form an opening window which is arranged above the through hole;
    depositing metal through the opening window and patterning the metal to form a metal pillar and a circuit layer, the metal pillar passing through the through hole, the circuit layer being arranged on the upper surface and/or a lower surface of the glass frame and being connected to the electronic component and the metal pillar; and
    forming a solder mask on a surface of the circuit layer, and patterning the solder mask to form a pad which is connected to the circuit layer.

2. The method of claim 1, wherein the opening window is also able to be arranged above the electronic component.

3. The method of claim 1, wherein photoetching the dielectric layer to form an opening window further comprises the following steps:
    depositing a metal seed layer, the metal seed layer being attached to a sidewall of the through hole and to the dielectric layer and to a surface of the electronic component;
    attaching a photosensitive barrier layer on a surface of the metal seed layer and patterning the photosensitive barrier layer, so as to form the metal pillar and the circuit layer;
    performing stripping to remove the photosensitive barrier layer and etching the metal seed layer to keep the metal seed layer consistent with the circuit layer.

4. The method of claim 1, wherein the number of the through hole and the chip embedding cavity is at least one, and a plurality of chip embedding cavities may have the same or different volumes.

5. The method of claim 1, wherein the dielectric layer is photosensitive resin material with fluidity.

6. The method of claim 5, wherein photoetching the dielectric layer to form an opening window comprises the following steps:
- exposing to light, developing and patterning the dielectric layer to form the opening window;
- heating the developed dielectric layer to cure the dielectric layer.

7. The method of claim 1, wherein the dielectric layer is coated directly to the upper surface of the glass frame.

8. The method of claim 7, wherein the dielectric layer is a fluid resin.

9. The method of claim 1, wherein the method avoids a step of press-fitting the dielectric material to the glass frame.

* * * * *